(12) United States Patent
Glenn et al.

(10) Patent No.: US 6,472,758 B1
(45) Date of Patent: Oct. 29, 2002

(54) SEMICONDUCTOR PACKAGE INCLUDING STACKED SEMICONDUCTOR DIES AND BOND WIRES

(75) Inventors: Thomas P. Glenn, Gilbert; Lee J. Smith, Chandler; David A. Zoba, Chandler; Kambhampati Ramakrishna, Chandler; Vincent DiCaprio, Mesa, all of AZ (US)

(73) Assignee: Amkor Technology, Inc., Chandler, AZ (US)

( * ) Notice: Subject to any disclaimer, the term of this patent is extended or adjusted under 35 U.S.C. 154(b) by 10 days.

(21) Appl. No.: 09/620,444

(22) Filed: Jul. 20, 2000

(51) Int. Cl.[7] .............................................. H01L 23/48
(52) U.S. Cl. ...................... 257/777; 428/64.1; 438/112; 361/386
(58) Field of Search ........................ 257/777; 428/64.1; 438/112; 361/386

(56) References Cited

U.S. PATENT DOCUMENTS

| | | | |
|---|---|---|---|
| 3,851,221 A | 11/1974 | Beaulieu et al. ............ 317/100 |
| 4,103,318 A | 7/1978 | Schwede .................... 361/388 |
| 4,361,261 A | 11/1982 | Elles et al. ................. 228/103 |
| 4,444,349 A | 4/1984 | Bilane et al. ............... 228/102 |
| 4,586,642 A | 5/1986 | Dreibilbis et al. ........... 228/4.5 |
| 4,730,232 A | 3/1988 | Lindberg .................... 361/381 |
| 4,763,188 A | 8/1988 | Johnson ....................... 357/74 |
| 4,862,322 A | * 8/1989 | Bickford et al. ............. 361/386 |
| 4,982,265 A | 1/1991 | Watanabe et al. ............. 357/75 |
| 5,025,306 A | 6/1991 | Johnson et al. ............... 357/75 |
| 5,040,052 A | 8/1991 | McDavid ..................... 357/80 |
| 5,140,404 A | 8/1992 | Fogal et al. .................. 357/70 |

(List continued on next page.)

FOREIGN PATENT DOCUMENTS

| | | | |
|---|---|---|---|
| JP | 61059862 A | 3/1986 | ........... H01L/25/04 |
| JP | 61117858 A | 6/1986 | ........... H01L/25/08 |
| JP | 62119952 A | 6/1987 | ........... H01L/25/04 |
| JP | 62126661 A | 6/1987 | ........... H01L/25/04 |
| JP | 62126661 | 6/1987 | ........... H01L/25/04 |
| JP | 62142341 A | 6/1987 | ........... H01L/25/04 |
| JP | 63128736 | 6/1988 | ........... H01L/23/04 |
| JP | 63211663 A | 9/1988 | ........... H01L/25/08 |
| JP | 63244654 | 10/1988 | ........... H01L/23/28 |
| JP | 01099248 A | 4/1989 | ........... H01L/25/08 |
| JP | 04028260 A | 1/1992 | ......... H01L/25/065 |
| JP | 04056262 A | 2/1992 | ......... H01L/25/065 |
| JP | 4056262 | 2/1992 | ......... H01L/25/065 |
| JP | Hei 10-56470 | 9/1998 | ......... H01L/25/065 |

*Primary Examiner*—David Nelms
*Assistant Examiner*—Mai-Huong Tran
(74) *Attorney, Agent, or Firm*—Skjerven Morrill LLP; James E. Parsons (57) ABSTRACT

This invention provides a method for making a semiconductor package with stacked dies that eliminates fracturing of the upper die(s) during the wire bonding process. One embodiment of the method includes the provision of a substrate and pair of semiconductor dies, each having opposite top and bottom surfaces and a plurality of wire bonding pads around the peripheries of their respective top surfaces. One die is attached and wire bonded to a top surface of the substrate. A measured quantity of an uncured, fluid adhesive is dispensed onto the top surface of the first die, and the adhesive is squeezed toward the edges of the dies by pressing the bottom surface of the second die down onto the adhesive until the two dies are separated by a layer of the adhesive. The adhesive is cured, the second die is then wire bonded to the substrate, and the dies are then molded over with an encapsulant. The layer of adhesive prevents the second die from shorting the wires on the top of the first die, prevents the second die from being fractured during the wire bonding process, and prevents the encapsulant from forming a thermally expansive wedge between the two dies.

27 Claims, 5 Drawing Sheets

U.S. PATENT DOCUMENTS

| | | | |
|---|---|---|---|
| 5,172,215 A | 12/1992 | Kobayashi et al. | 257/584 |
| 5,176,311 A | 1/1993 | Levine et al. | 228/179 |
| 5,177,032 A | 1/1993 | Fogal et al. | 437/220 |
| 5,291,060 A | 3/1994 | Shimizu et al. | 257/667 |
| 5,291,061 A | 3/1994 | Ball | 257/686 |
| 5,323,060 A | 6/1994 | Fogal et al. | 257/777 |
| 5,384,689 A | 1/1995 | Shen | 361/761 |
| 5,432,729 A | 7/1995 | Carson et al. | 365/63 |
| 5,438,224 A * | 8/1995 | Papageorge et al. | 257/777 |
| 5,620,928 A | 4/1997 | Lee et al. | 438/118 |
| 5,682,062 A | 10/1997 | Gaul | 257/686 |
| 5,721,452 A | 2/1998 | Fogal et al. | 257/685 |
| 5,739,581 A | 4/1998 | Chillara et al. | 257/668 |
| 5,815,372 A | 9/1998 | Gallas | 361/760 |
| 5,872,025 A | 2/1999 | Cronin et al. | 438/109 |
| 5,877,478 A * | 3/1999 | Ando | 257/777 |
| 5,886,412 A | 3/1999 | Fogal et al. | 257/777 |
| 5,989,982 A | 11/1999 | Yoshikazu | 438/462 |
| 6,005,778 A | 12/1999 | Spielberger et al. | 361/770 |
| 6,013,948 A | 1/2000 | Akram et al. | 257/698 |
| 6,030,855 A | 2/2000 | Bertin et al. | 438/109 |
| RE36,613 E | 3/2000 | Ball | 257/777 |
| 6,033,931 A | 3/2000 | Hoffman et al. | 438/109 |
| 6,051,886 A | 4/2000 | Fogal et al. | 257/777 |
| 6,057,598 A | 5/2000 | Payne et al. | 257/723 |
| 6,214,432 B1 * | 4/2001 | Chullino et al. | 428/64.1 |
| 6,232,148 B1 * | 5/2001 | Ma et al. | 438/112 |
| 6,239,496 B1 * | 5/2001 | Asada | 257/777 |
| 6,262,488 B1 * | 7/2001 | Masayuki et al. | 257/777 |

* cited by examiner

SEMICONDUCTOR PACKAGE INCLUDING STACKED SEMICONDUCTOR DIES AND BOND WIRES

RELATED APPLICATIONS

This application is related to U.S. patent application Ser. No. 09/730,721, filed Dec 6, 2000, now U.S. Pat. No. 6,340,846, issued Jan, 22, 2002.

BACKGROUND

1. Technical Field

This invention pertains to semiconductor packaging in general, and in particular, to a method and apparatus for making semiconductor packages with stacked dies.

2. Related Art

The increasing demand for electronic devices that are smaller, lighter, and yet more functional has resulted in a concomitant demand for semiconductor packages that have smaller outlines and mounting footprints, yet which are capable of increased component packaging densities.

One approach to satisfying this demand has been the development of techniques for stacking the semiconductor dies, or "chips," contained in the package on top of one another. Examples of die-stacking techniques may be found, for example, in U.S. Pat. No. 5,323,060 to R. Fogel, et al.; U.S. Pat. No. 5,815,372 to W. N. Gallas; Re. Pat. No. 36,613 to M. B. Ball; U.S. Pat. No. 5,721,452 to R. Fogel, et al.; and, Japanese Patent Disclosures 62-126661, 4-56262, 63-128736, and 10-256470.

Figure 1:
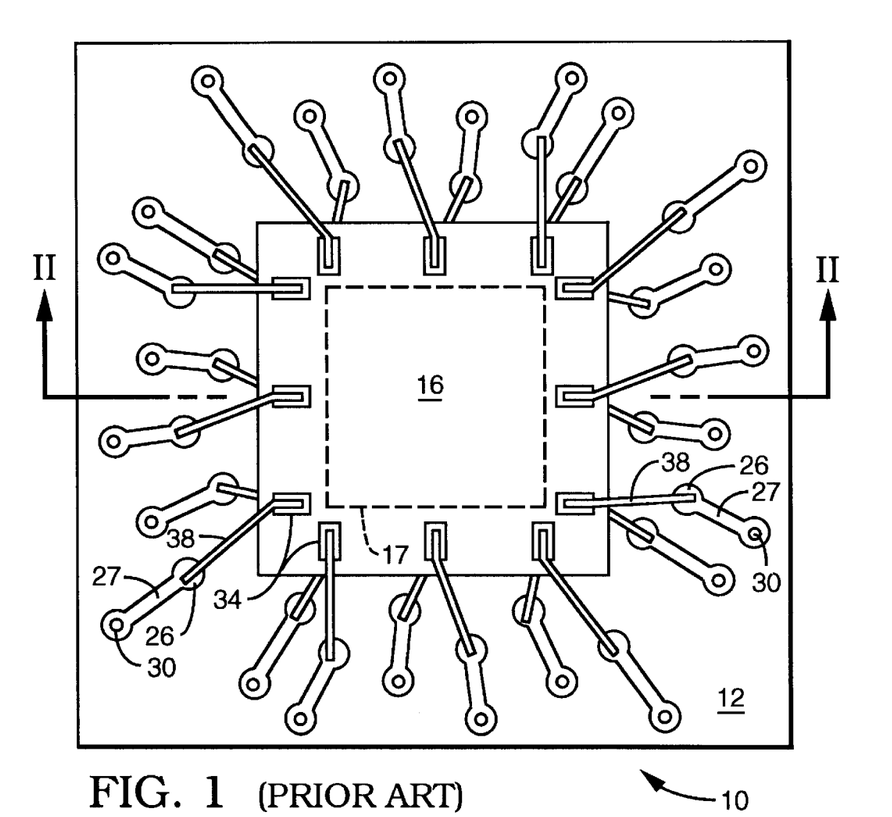
FIG. 1 is a top plan view of a semiconductor package with stacked dies made in accordance with the prior art.
Figure 2:
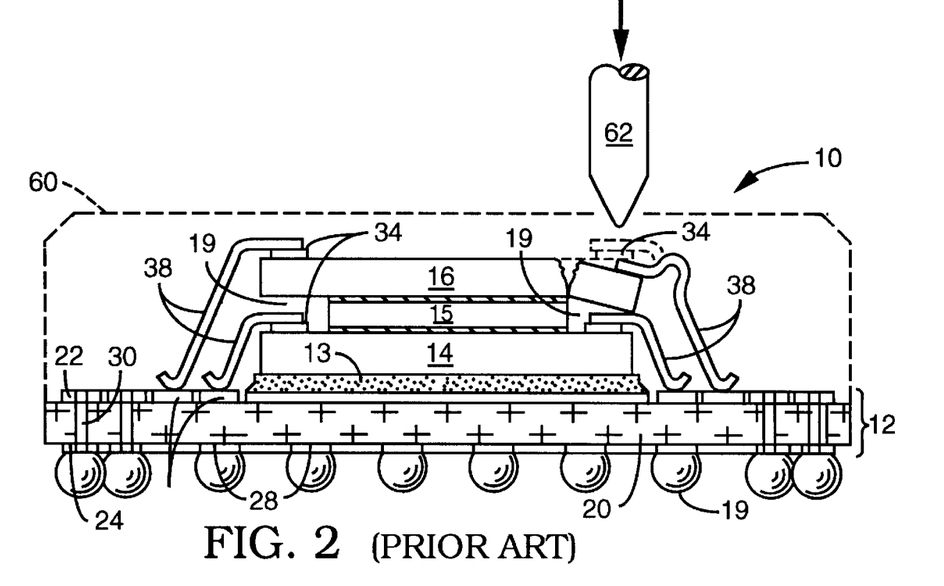
FIG. 2 is a cross-sectional side elevation view into the prior art package illustrated in FIG. 1, as revealed by the section taken along the lines II—II therein.

FIGS. 1 and 2 are respectively a top plan and a cross-sectional side elevation view of a semiconductor package 10 incorporating a pair of stacked dies 14 and 16 in accordance with the respective methods and apparatus of the prior art. The package 10 illustrated is a ball grid array ("BGA") type of package, so-called because of the balls of solder 19 formed on the bottom surfaces of the substrate 12, which function as input/output terminals of the package. The package 10 includes a conventional interconnective substrate 12 and a first semiconductor die 14 mounted on a top surface of the substrate. A second die 16 has been "stacked," i.e., mounted, on top of the first die 14. The dies 14 and 16 typically include a plurality of input/output wire bonding pads 34 located at the peripheral edges of their respective top, or "active," surfaces.

The substrate 12 may comprise a flexible resin tape, a rigid fiber-glass/copper sheet laminate, a co-fired ceramic coupon, or a metal lead frame, all of known types in the industry, depending on the particular type of semiconductor package 10 at hand. The connective substrate 12 illustrated in the BGA package 10 shown in FIGS. 1 and 2 comprises a layer 20 (see FIG. 2) of an insulative material, e.g., a polyimide resin film, laminated between conductive layers 22, 24 of a metal, e.g., copper or aluminum, that comprise the respective top and bottom surfaces of the substrate.

The conductive layers 22, 24 are typically patterned, e.g., by photolithography and etching techniques, to define wire bonding pads 26 and circuit traces 27 in the top layer 22, and solder ball mounting lands 28 in the bottom layer 24. The terminal pads 26 and traces 27 are typically connected to the solder ball lands 28 through the thickness of the insulative layer 20 by "vias" 30, i.e., plated-through holes in the layers. Either or both of the conductive layers 22, 24 may be coated over with an insulative "solder mask" (not illustrated) that has openings in it through which the respective wire bonding pads 26 and/or solder ball lands 28 are exposed, and which serve to prevent bridging between the pads and/or lands by accidental solder splashes.

In an alternative embodiment, the substrate 12 may comprise a metal lead frame (not illustrated) having a die-mounting paddle centrally supported within a matrix of radially extending leads. In this embodiment, the dies 14 and 16 wire bond to inner ends of the leads of the lead frame, rather to bonding pads located on the substrate, and the formed leads serve as the input/output terminals of the package 10.

In the embodiment illustrated, the first die 14 is conventionally mounted to the top surface of the substrate 12 with, e.g., a layer of an adhesive or an adhesive film 13, and then electrically connected to the substrate by a plurality of fine, conductive wires 38, typically gold or aluminum, that connect the pads 34 on the die to the pads 26 on the substrate.

The second die 16 is mounted on the top surface of the first die 14 with an adhesive layer 15 comprising a second layer of an adhesive or a double-backed adhesive film that has a lateral perimeter 17 (shown by the dotted outline in FIG. 1) positioned entirely within the central area of the top surface of the first die and completely inside of the peripheral wire bonding pads 34 thereon. That is, the adhesive layer 15 does not contact or cover either the wire bonding pads 34 or the conductive wires 38 bonded thereto. The adhesive layer 15 positions the second die 16 sufficiently far above the first die 14 to prevent the former die from contacting the conductive wires 38 bonded to the latter die and shorting them out, and thus defines a peripheral space 19 (FIG. 2) between the two dies that extends around the entire perimeter 17 of the spacer. The second die 16 is then wire bonded to the substrate 12 in the same fashion as the first die 14. One or more additional dies (not illustrated) can then be stacked in tandem on top of the second die 16 using the same technique.

After the dies 14 and 16 are wire bonded to the substrate 12, the dies, substrate, and conductive wires 38 are "over-molded" with a dense, monolithic body, or "mold cap" 60 (shown by dotted outline in FIG. 2, omitted for clarity in FIG. 1), of plastic, typically a filled epoxy resin, that encapsulates the packaged parts and protects them from environmental elements, particularly moisture.

In a stacked-die package 10 of the type illustrated in FIGS. 1 and 2, the dies 14 and 16 are wire bonded sequentially, typically with automat ed wire bonding equipment employing well-known thermal-compression or ultra-sonic wire bonding techniques. As shown in FIG. 2, during the wire bonding process, the head 62 of a wire bonding apparatus applies a downward pressure on a conductive wire 38 held in contact with a wire bonding pad 34 on the die to effect a weld or bond of the wire to the pad.

Since the wire bonding pads 34 are located in the peripheral area of the respective top surfaces of the two dies, this entails the application, in the direction of the arrow shown in FIG. 2, of a relatively large, localized force to that area of the die. This does not present a problem with the bottom die 14, as it is supported from below by the substrate 12 and the adhesive layer 13. However, in the case of the second, top die 16, its peripheral portion is cantilevered out over the peripheral portion of the bottom die 14 by the adhesive layer 15, and is therefore unsupported from below. As a consequence, the top die 16 can crack or fracture during the wire bonding procedure, as illustrated in FIG. 2, which results in the entire assembly being scrapped.

Another problem that can result with the prior art die stacking techniques also relates to the peripheral space created between the opposing surfaces of the first and second dies 14 and 16 by the adhesive layer 15 and the plastic molding material used to form the body 60 that encapsulates the dies. In particular, the encapsulant material penetrates into the peripheral space during the molding process and forms a "wedge" between the two dies. If the encapsulant material has a different thermal coefficient of expansion than that of the adhesive spacer 15, it is possible for this wedge to expand within the peripheral space 19 with large changes in temperature of the package 10, and thereby fracture one or both of the dies 14 and 16, again resulting in a defective package that must be scrapped.

BRIEF SUMMARY

This invention provides a simple, inexpensive method for making a semiconductor package with stacked dies that eliminates fracturing of the dies during the wire bonding process or as a result of incompatible thermal expansions. The method permits the use of ultra-thin dies having the same size, and does not require the use of support pillars.

In one embodiment, the method includes the provision of a substrate, which may be either a conventional laminate or a lead-frame-type of substrate. A pair of semiconductor dies having the same size (e.g., identical dies), or at least the same length and width, are also provided. Each die has opposite top and bottom surfaces and a plurality of wire bonding pads located around the periphery of the top surface thereof. The bottom surface of the first die is attached to a top surface of the substrate, and the wire bonding pads on the first die are connected to wire bonding areas on the top surface of the substrate with a first plurality of conductive wires.

A measured quantity of an uncured, electrically non-conductive, fluid adhesive is dispensed onto the top surface of the first die. The adhesive is then squeezed, or distributed, laterally between the two dies and toward their respective peripheries by pressing the bottom surface of the second die down onto the adhesive until: 1) the bottom surface of the second die is spaced apart from the top surface of the first die by a layer of the adhesive thick enough to prevent shorting contact between the second die and the conductive wires bonded to the top surface of the first die; 2) each portion of the second die located below a respective one of the wire bonding pads on the top surface of the second die is supported from below by the layer of adhesive; and, 3) the wire bonding pads on the top surface of the first die and the inner ends of the conductive wires bonded thereto are encapsulated by the adhesive.

The adhesive is then cured, and the wire bonding pads on the top surface of the second die are wire bonded to wire bonding areas on the top surface of the substrate with a second plurality of conductive wires. The solidified layer of adhesive below the peripheral portion of the second die on which the wire bonding pads are located supports the die from below and thereby prevents the die from fracturing during the wire bonding process. In addition, because the adhesive substantially fills the peripheral space between the opposing surfaces of the two dies, it prevents the molding compound or other encapsulant formed over the stacked dies from flowing into the space and forming a potentially destructive "thermal wedge" between the dies. Further, since the adhesive 40 also covers the wire bonding pads 34 on the top surface of the first die 14, as well as the inner ends of the conductive wires 38 that are bonded thereto, it thereby helps to maintain the integrity of the electrical connection between the wires and the first die during the subsequent molding or other manufacturing processes.

A better understanding of the above and other features and advantages of the invention may be had from a consideration of the detailed description below of some exemplary embodiments thereof, particularly if such consideration is made in conjunction with the appended drawings.

DETAILED DESCRIPTION

Figure 3:
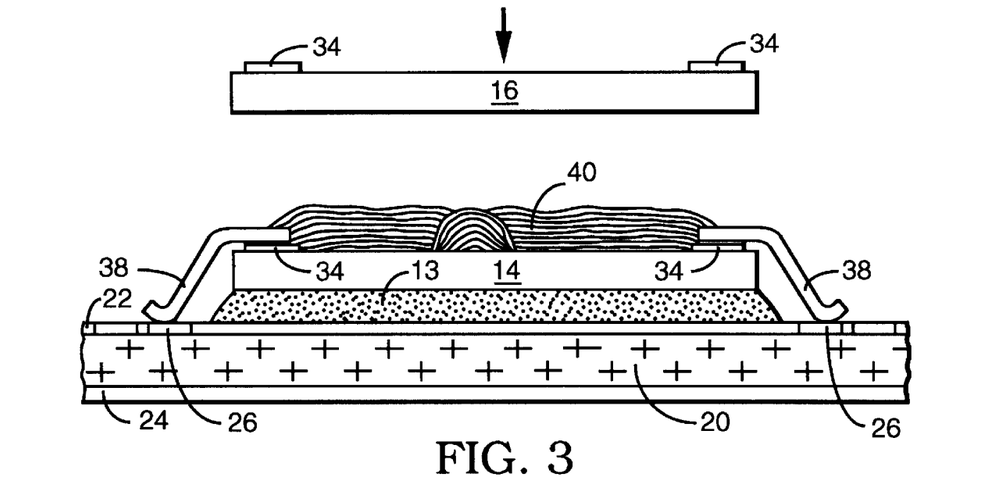
FIG. 3 is a cross sectional side elevation view into a semiconductor package with stacked dies made in accordance with a first exemplary embodiment of the present invention, before a second, top die is mounted on the top surface of a first, bottom die.
Figure 4:
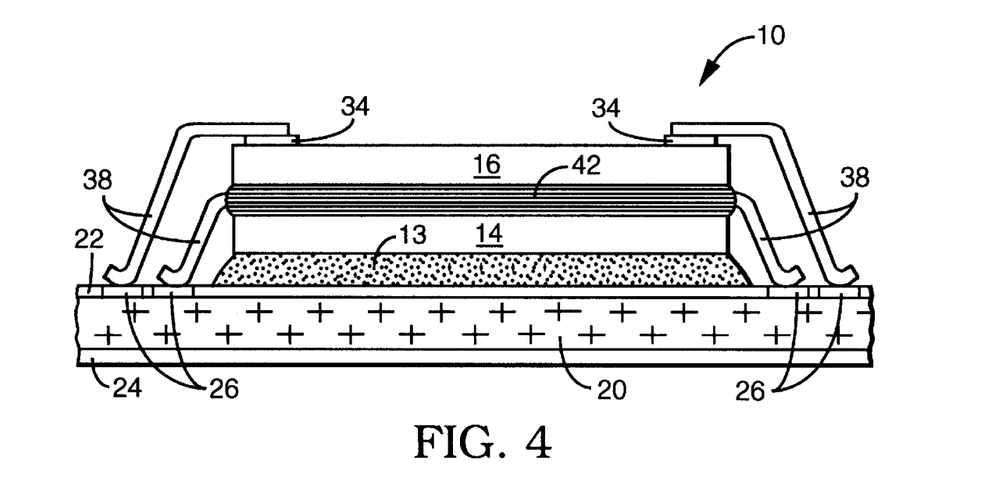
FIG. 4 is a cross sectional side elevation view into the package illustrated in FIG. 3 after the second die is mounted on the top surface of the first die.

A first exemplary embodiment of a semiconductor package 10 with stacked dies 14 and 16 made in accordance with the method of the present invention is illustrated in the cross-sectional views of FIGS. 3 and 4 respectively, in which elements similar to those of the prior art stacked-die package 10 illustrated in FIGS. 1 and 2 are labeled with similar reference numerals.

The first embodiment of the package 10 shown includes a conventional laminate-type substrate 12 comprising an insulative layer 20 sandwiched between top and bottom layers 22, 24 of a metal, e.g., copper or aluminum. However, it should be understood that, in any of the embodiments described herein, a lead-frame-type of substrate can be substituted for the laminate-type substrate illustrated.

A first semiconductor die 14 is provided which has opposite top and bottom surfaces and a plurality of wire bonding pads 34 located around the periphery of the top surface thereof. The bottom surface of the first die 14 is attached to a top surface of the substrate 12 with, e.g., an adhesive tape or a layer of an adhesive 13, in a conventional manner, which may be effected with automated die-attach apparatus of a type known in the industry.

After the first die 14 is attached to the substrate 12, the wire bonding pads 34 on the top surface of the die are connected to wire bonding areas 26 on the top surface of the substrate with a first plurality of conductive wires 38 in a conventional manner, which may also be effected with automated wire bonding equipment of a known type.

As illustrated in FIG. 3, after the first die 14 has been attached and wire bonded to the substrate 12, a measured quantity of an uncured, fluid adhesive 40 is dispensed onto the top surface of the first die 14 at about the center thereof. Advantageously, the adhesive 40 is dispensed onto the first die 14 in a "star-burst" pattern 41 having radial lines (shown by phantom outline in FIG. 9) to achieve a generally rectangular spread of the adhesive in the manner described below.

The adhesive 40 can comprise a wide variety of known types of die attach adhesives, e.g., Hysol 4323, 4451, or 4450, available from Dexter, Inc., City of Industry, Calif. It is desirable that the adhesive 40 have a relatively high, paste-like viscosity, e.g., about $1–2\times10^6$ centipoise, so that the adhesive will remain in place on the surface of the die 14 after dispensing, and not run off of it quickly, such as would a thin, liquid adhesive.

A second semiconductor die 16 is provided having opposite top and bottom surfaces, and a plurality of wire bonding pads 34 located around the periphery of the top surface thereof. The length and width of the second die 16 are respectively equal to the length and width of the first die 14, as would be the case where the two dies are identical to one another, e.g., the dies in a memory device.

Figure 9:
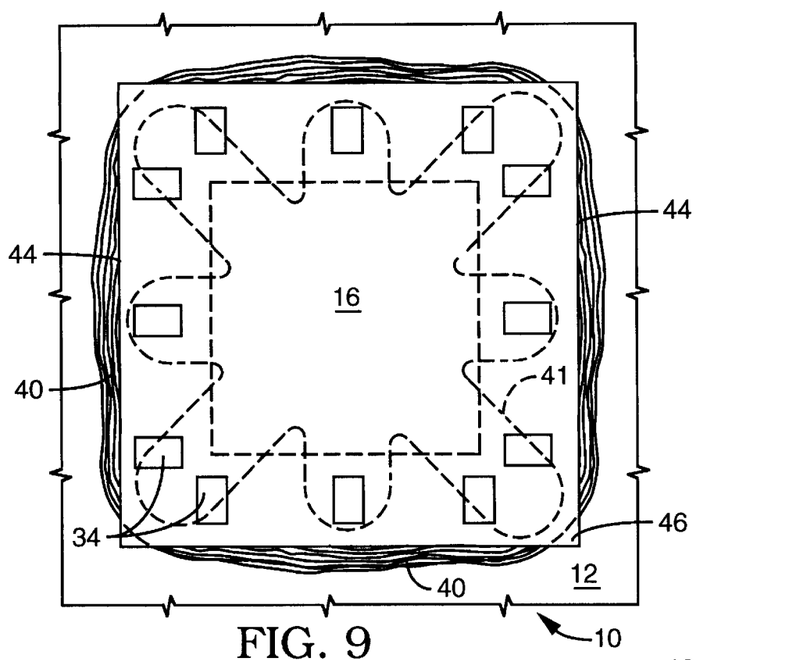
FIG. 9 is a top plan view of a portion of the first and second exemplary embodiments illustrated in FIGS. 4 and 6, respectively, after the attachment of the second die to the first die; and, FIG. 10 is a top plan view of a portion of the third exemplary embodiment of semiconductor package illustrated in FIG. 8 after the attachment of the second die to the first die.

As shown in FIG. 3, the second die 16 is attached to the top surface of the first die 14 by pressing its bottom surface down onto the adhesive 40 in the direction of the arrow shown therein, which has the effect of squeezing, or distributing, the adhesive radially outward from the center of the two opposing die surfaces in a generally rectangular pattern, as shown in FIG. 9.

The second die 16 is pressed down onto the adhesive 40 until a desired bond line thickness and lateral extent of the adhesive are obtained. In particular: 1) the resulting bond line thickness is such that the bottom surface of the second die is spaced apart from the top surface of the first die 14 by a layer 42 of the adhesive 40 thick enough to prevent the bottom surface of the second die from contacting any of the first plurality of conductive wires 38 extending over the top surface of the first die 14; and 2) the radial extent of the layer 42 of adhesive 40 is such that it covers substantially all of the top surface of the first die 14 and the bottom surface of the second die 16, including the bonding pads 34 on the top surface of the first die 14 and the inner ends of the first plurality of conductive wires 38 bonded thereto.

As a result of this distribution of the adhesive 40, the second die 16 is fully supported from below over its entire area, including the peripheral area of the wire bonding pads 34 on the top surface thereof. Also, because the adhesive 40 substantially fills the peripheral space 19 (see FIG. 2) between the opposing surfaces of the two dies 14 and 16, the adhesive prevents the molding compound or other encapsulant subsequently molded over the stacked dies from flowing into the space and forming a potentially destructive wedge between the dies. In addition, the adhesive 40 encapsulates the wire bonding pads 34 on the top surface of the first die 14, as well as the inner ends of the conductive wires 38 that are bonded thereto, and thereby helps to maintain the integrity of the electrical connection between the wires and the pads during the subsequent molding or other encapsulation process, during which the connections may be subject to substantial pulling forces due to, e.g., "wire sweep."

In an alternative embodiment, the small space between the corners 46 of the two dies 14 and 16 (see FIG. 9) may be left void of the adhesive 40 in the case where there are no wire bonding pads 34 on the top surface of the second die that are superposed over the corners. However, in such a case, care should be exercised in the selection of the respective coefficients of thermal expansion of the adhesive 40 and the material(s) of the molded body 60 to prevent the thermal-wedge problem between the dies discussed above.

The desired bond line thickness and lateral extent of the adhesive described above are achieved by carefully controlling: 1) the quantity of adhesive 40 dispensed onto the top surface of the first die 14; and, 2) the distance the second die 16 is pressed down onto the adhesive. Control of both parameters can be effected with conventional automated adhesive-dispensing and die-attachment apparatus currently available in the packaging industry, although the die-attach apparatus must be capable of fairly precise vertical, or "Z-axis," control of the die chuck, typically effected with closed-loop, positional-feedback-controlled equipment. A commercially available die-attach machine capable of achieving this degree of Z-axis control is, e.g., the MRSI-375 die-attacher available from MRSI of Chelmsford, Mass., or its equivalent.

As may be seen in the top plan view of FIG. 9, the adhesive 40 will typically reach the middle 44 of the edges of the dies 14 and 16 before it reaches their corners 46. When the upper die 16 has wire bonding pads 34 located at its corners, it is necessary to express the adhesive 40 until the adhesive layer 42 reaches the spaces below the corners 46 of the die, i.e., until substantially all of the upper die 16 is supported by the layer of adhesive.

When the adhesive 40 has been distributed between the two opposing surfaces of the dies 14 and 16 as above, the adhesive is cured to solidify it, which, depending on the type of adhesive employed, may be effected by, e.g., heating the adhesive, or irradiating it with ultra-violet ("U.V.") light. When the adhesive 40 is cured, the wire bonding pads 34 on the top surface of the second die 16 may be safely wire bonded to the wire bonding areas 26 on the top surface of the substrate 12 with a second plurality of conductive wires 38 (see FIG. 4) without fracturing the second, top die 16, because the cured layer 42 of adhesive 40 supports the portions of the top die located below the bonding pads 34 thereof against the bending and shear forces associated with the wire bonding operation discussed above in connection with FIG. 2. The thickness of the layer of adhesive 42 is sufficient to space the bottom surface of the second die 16 far enough above the top surface of the first die 14 to prevent shorting contact between the bottom surface of the second die and the conductive wires 38 bonded to the wire bonding pads 34 on the top surface of the first die.

After the second die 16 is attached to the top surface of the first die 14, the wire bonding pads 34 on the top surface of the second die are connected to bonding areas on the substrate with a second plurality of conductive wires 38, and a monolithic body 60 (omitted for clarity) of, e.g., a molding compound or a liquid encapsulant is formed over the substrate 12, the stacked dies 14 and 16, and the first and second plurality of conductive wires 38.

Where the die-attach equipment lacks the precision of Z-axis control described above, it may be desirable to include an alternate mechanism for precisely controlling the final bond line thickness of the adhesive layer 42 distributed between the opposing surfaces of the two dies 14 and 16. As shown in the second exemplary embodiment of semiconductor package 10 illustrated in FIGS. 5 and 6, this can be achieved simply and inexpensively by filling the uncured, fluid adhesive 40 with a quantity of microspheres 48, each having a diameter approximately equal to the desired final thickness of the layer 42 of adhesive 40.

Figure 5:
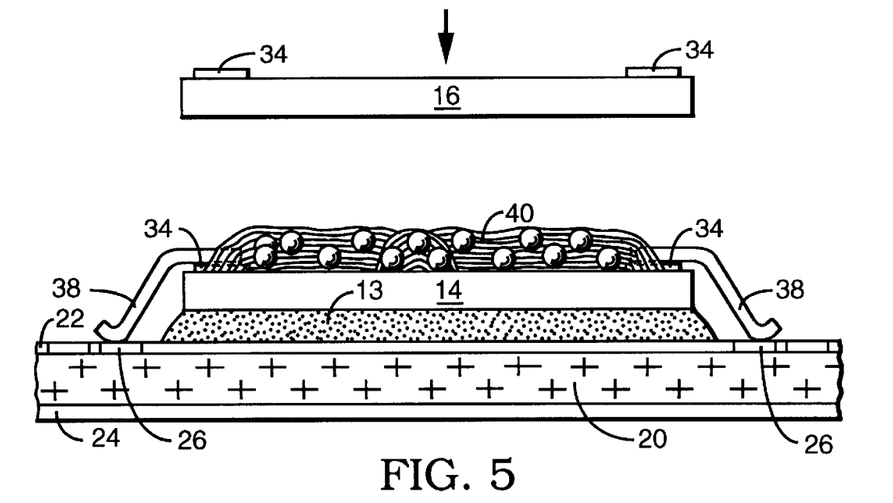
FIG. 5 is a cross sectional side elevation view into a semiconductor package with stacked dies made in accordance with a second exemplary embodiment of the present invention, before a second, top die is mounted on the top surface of a first, bottom die.
Figure 6:
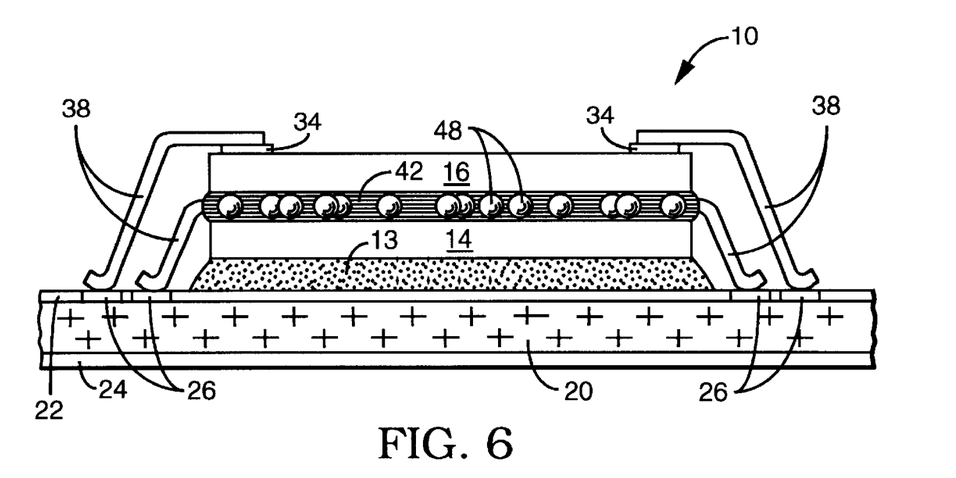
FIG. 6 is a cross sectional side elevation view into the package illustrated in FIG. 5 after the second die is mounted to the top surface of the first die.

As illustrated in the figures, the second die 16 is then simply pressed down onto the filled adhesive 40 until the bottom surface of the second die "bottoms out" on the microspheres 48, i.e., is spaced apart from the top surface of the first die 14 by a single layer of the microspheres. As in the first embodiment, it is necessary that the cured layer 42 of the filled adhesive 40 extend below each of the wire bonding pads 34 on the top surface of the second die 16 to achieve the desired support of the second die 16. It is further desirable that the cured layer 42 of adhesive 40 extend laterally to the edges 44 of the opposing surfaces of the two dies 14 and 16 so that molded encapsulant of the body 60 cannot flow into the peripheral space 19 between the dies and create a potential "thermal wedge" therein.

In one embodiment, the material of the microspheres 48 can be selected such that they maintain their spherical nature regardless of the curing processes applied to the adhesive 40 matrix in which they are incorporated, e.g., glass, silicon dioxide, silicon nitride, or polytetraflouroethylene (Teflon) microspheres. Other materials can be selected that cause the microspheres to become integrally "homogenized" into the fluid adhesive 40 matrix when the latter cures, e.g., a thermoplastic polymer that melts at the same temperature at which a thermo-curing adhesive is cured. The microspheres 48 can be fabricated from a variety of suitable materials using a variety of known techniques, e.g., by pumping or blowing a molten material through a nozzle under high pressure to atomize it, then cooling or curing the varying-sized spherical bodies thereby produced with a bath of, e.g., air, water or oil. The microspheres 48 can then be passed through a series of screens of graduated mesh sizes to grade them by diameter.

Figure 7:
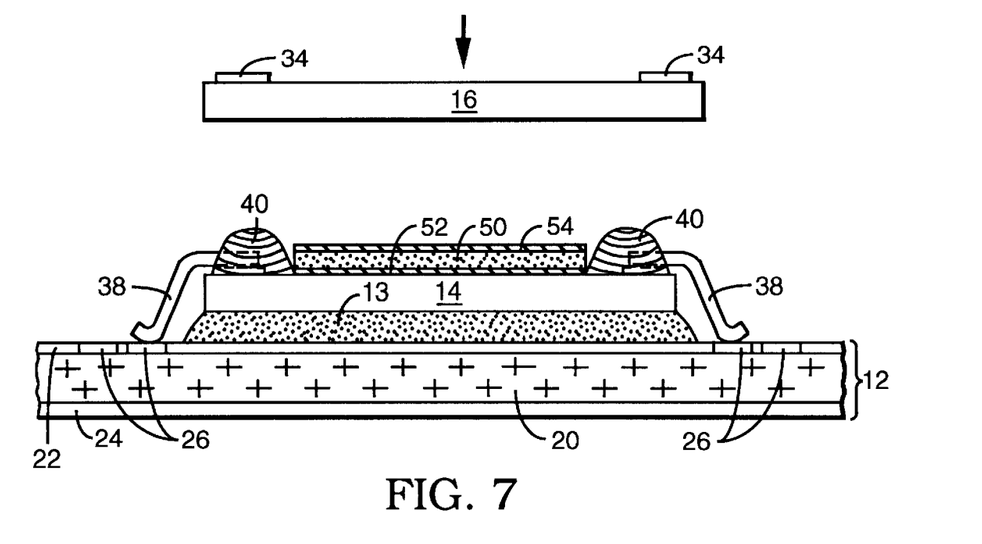
FIG. 7 is a cross sectional side elevation view into a semiconductor package with stacked dies made in accordance with a third exemplary embodiment of the present invention, before a second, top die is mounted to the top of a first, bottom die.
Figure 8:
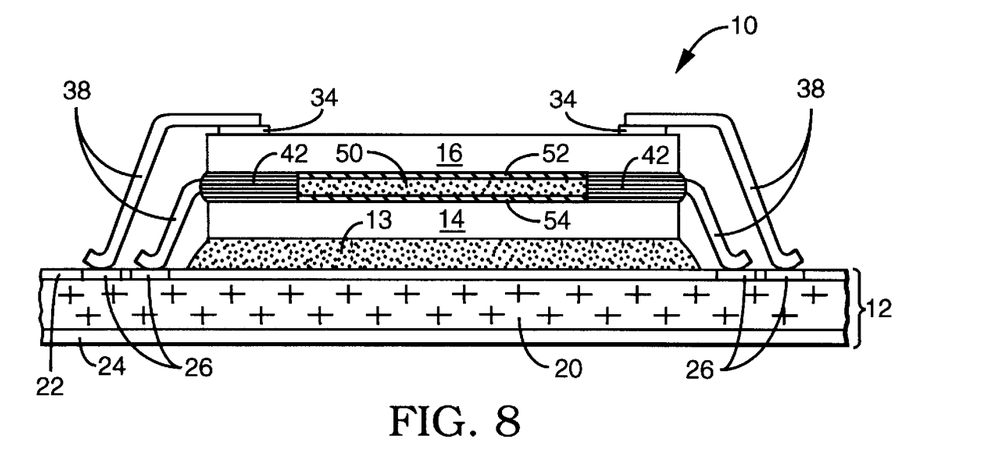
FIG. 8 is a cross sectional side elevation view into the package illustrated in FIG. 7 after the second die is mounted to the top surface of the first die.

An effective alternative to the filled-adhesive method of the second exemplary embodiment described above is provided by the third exemplary embodiment of the method and package 10 of the present invention illustrated in FIGS. 7 and 8. The third embodiment comprises interposing a spacer 50 between the top surface of the first die 14 and the bottom surface of the second die 16. The spacer 50 has opposite top and bottom surfaces, each with a respective layer 54 and 52 of an adhesive thereon, an overall thickness equal to the desired final thickness of the layer 42 of adhesive 40 between the first and second dies 14 and 16, and a perimeter 17 (shown as a dotted line in FIG. 10) positioned inside of the wire bonding pads 34 on the top surface of the first die 14.

As illustrated in FIG. 7, the first die 14 is conventionally attached to the substrate 12 with a layer of adhesive or double-backed adhesive tape 13, as in the first and second embodiments above, then wire bonded to the substrate with a first plurality of conductive wires 38. The spacer 50 is then attached to the top surface of the first die 14 with the layer of adhesive 52, such that the perimeter 17 of the spacer is positioned inside of the wire bonding pads 34 on the top surface of the first die. A bead of uncured, fluid adhesive 40 is dispensed onto the top surface of the first die 14 outside of and completely around the perimeter 17 of the spacer 50, and the second die 16 is pressed down onto the first die until its bottom surface contacts the layer 54 of adhesive on the top surface of the spacer 50.

Figure 10:
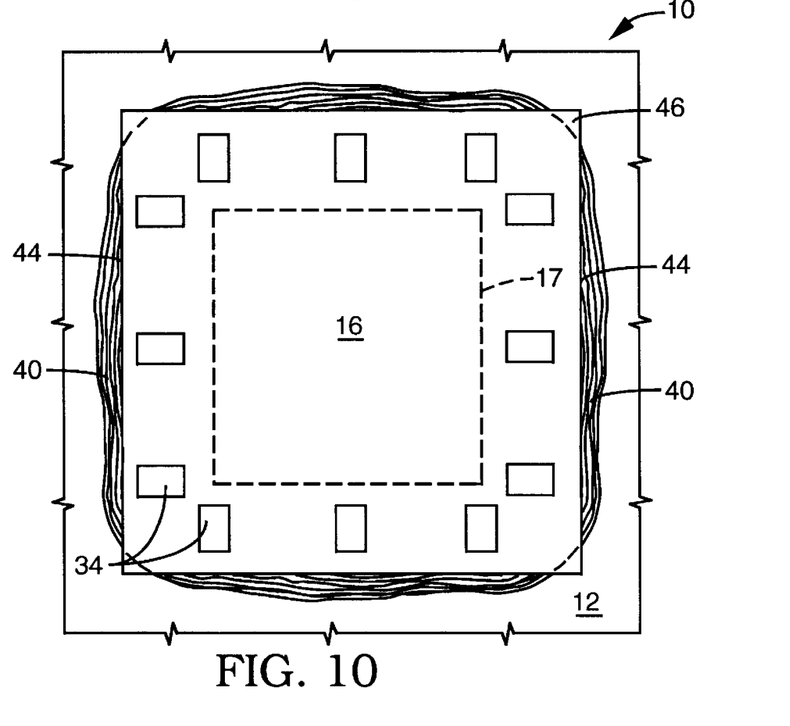

The pressure of the second die 16 on the fluid adhesive 40 forces the adhesive outward from spacer 50 and toward the edges 44 of the two dies in a generally rectangular pattern, as illustrated in the plan view of FIG. 10, and the second die is pressed down until its bottom surface is spaced apart from the top surface of the first die 14 by the thickness of the spacer. The adhesive 40 covers the wire bonding pads 34 on the top surface of the first die 14 and the connections of the first plurality of bonding wires to those pads, and substantially fills the peripheral space between the two dies. The adhesive 40 thus covers the entire area of the respective top and bottom surfaces of the first and second dies 14 and 16 that are not already covered by the spacer 50, thereby excluding the encapsulant of the package body 60 (see FIG. 2) from the space 19 between the stacked dies.

In an alternative embodiment, viz., one in which there are no wire bonding pads 34 in the corners of the top surface of the second die 16, the small space between the respective corners 46 (FIG. 10) of the two dies 14 and 16 may be left void of the adhesive 40. However, as above, care should be exercised in the selection of materials of the adhesive 40, the spacer 50, and the encapsulant body 60 so that their respective coefficients of thermal expansion do not differ so substantially from one another that large changes in temperature of the package 10 do not cause the encapsulant penetrating into the space between the corners 46 of the dies to expand and fracture one or both of them.

The spacer 50 can be made from a variety of materials, including a fiberglass matrix impregnated with a tacky, uncured (i.e., "B-stage") epoxy resin, or a ceramic, silicon or an oxide thereof, or alternatively, a plastic polymer sheet cut to the appropriate size. The adhesive layers 52 and 54 can be applied to the spacer 50 before it is attached to the first die 14, or alternatively, can be applied sequentially at the time the spacer is mounted to the die, first to the top surface of the first die 14, then to the top surface of the spacer before the second die is mounted on top of it. In yet another variation, the adhesive layer 54 used to mount the second die 16 on the spacer 50 can comprise the same adhesive material as the bead of uncured, fluid adhesive 40 dispensed around the perimeter 17 of the spacer 50, and can be deposited simultaneously therewith. In all cases, the layers of adhesive 52 and 54 on the spacer 50, and the layer 42 of adhesive 40 may all be simultaneously cured in a single step.

It should be understood that many modifications, variations, and substitutions can be made in terms of the materials and methods of the present invention without departing from its scope and spirit. For example, it is possible to construct a "hybrid" embodiment that combines elements of the first, second and third embodiments by, e.g., dispensing a first quantity of an adhesive 40 filled with microspheres 48 in the central portion of the top surface of the first die 14, as in the second embodiment, then dispensing a bead of an unfilled adhesive 40 around the first quantity of filled adhesive, as in the third embodiment.

Another embodiment within scope of the present invention is a hybrid between the prior art package 10 of FIG. 1 and the second exemplary package 10 embodiment illustrated in FIGS. 5 and 6. In such an embodiment, a layer 42 of adhesive containing microspheres 48 is dispensed onto the top surface of the first die 14, but is applied such that, upon stacking the second die 16 thereon and curing the adhesive to harden it, the adhesive layer 42 is laterally confined entirely within the wire bonding pads 34 on the top surface of the first die 14. This embodiment has the advantage of a controlled bond line thickness between the dies 14 and 16, which spaces the second die 16 above the bottom die 14 so that the conductive wires 38 bonded to the first die 14 are not contacted by the second die 16. However, it will be understood that such an embodiment will be susceptible to the "cantilever" and thermal "wedging" problems discussed above. In such an embodiment, the second die 16 may be equal in size to the first die 14, or may have a length and/or a width that are respectively larger than the length and/or width of the first die 14, although such an embodiment would also be proportionately more susceptible to the "cantilever" problem than one in which the dies are the same size.

In yet another possible variation, it may be desirable in some instances to dispense a bead of adhesive 40 around the peripheral pads 34 on the second die 16 after it has been wire bonded to the substrate 12, in a manner similar to that described above in connection with the embodiment in FIGS. 7 and 8 to maintain the integrity of the electrical connection between the wires 38 and the pads on the second die during the subsequent encapsulation process.

Similarly, those of skill in the art will recognize that the methods of the invention described herein lend themselves readily to volume production methods in which a number of packages 10 are fabricated simultaneously in the form of a connected strip or array of identical packages that is subsequently cut apart, or "singulated," into individual packages.

In view of the foregoing, the scope of the present invention should not be limited to that of the particular embodiments described and illustrated herein, as these are merely exemplary in nature. Rather, the scope of this invention should be measured by that of the claims appended below, and their substantial equivalents.

What is claimed is:

1. A semiconductor package with stacked dies, the package comprising:

first and second semiconductor dies, each die having opposite top and bottom surfaces, a length and a width respectively equal to the corresponding length and width of the other die, and a plurality of wire bonding pads around the periphery of the top surface thereof;

a plurality of conductive wires electrically connected to the wire bonding pads on the first die;

a first layer of a hardened adhesive attaching the bottom surface of the second die to the top surface of the first die and encapsulating the wire bonding pads of the first die and the conductive wires connected thereto such that the bottom surface of the second die is superposed above the conductive wires connected to the first die without contacting the wires, and such that each portion of the second die located below a respective one of the wire bonding pads on the top surface of the second die is supported from below by the first layer of hardened adhesive; and, a monolithic body of an encapsulant over the first and second dies and the conductive wires.

2. The semiconductor package of claim 1, wherein the adhesive is filled with microspheres, and wherein the bottom surface of the second die is spaced above the top surface of the first die by a single layer of the microspheres.

3. The semiconductor package of claim 1, further comprising a spacer interposed between the top surface of the first die and the bottom surface of the second die, the spacer having a perimeter located inside of the wire bonding pads on the top surface of the first die, and wherein the first layer of adhesive occupies the peripheral space around the spacer and between the opposing surfaces of the two dies.

4. The semiconductor package of claim 2, wherein each of the first layer of adhesive and the microspheres comprises a polymer.

5. The semiconductor package of claim 4, wherein each of the first layer of adhesive and the microspheres comprises the same polymer.

6. The semiconductor package of claim 2, wherein the microspheres comprise glass, Teflon, silicon nitride, or silicon dioxide.

7. The semiconductor package of claim 3, wherein the spacer comprises a polyimide resin, a B-stage composite, a ceramic, or silicon.

8. The semiconductor package of claim 1, wherein the first layer of adhesive comprises a first portion filled with microspheres and a second portion free of microspheres surrounding the first portion, the bottom surface of the second die being spaced apart from the top surface of the first die by a single layer of the microspheres, and the second portion of the first layer of adhesive occupying the peripheral space around the first portion of the first layer of adhesive and between the opposing surfaces of two dies.

9. The semiconductor package of claim 1, wherein at least one of the first and second dies comprises a memory device.

10. A semiconductor package, comprising:

a substrate;

a stack of semiconductor dies coupled to the substrate;

a plurality of wires bonded between the substrate and an upper surface of the dies; and, a layer of a cured dielectric adhesive having a lateral periphery equal to or greater than a lateral periphery of a lower one of the dies and attaching a lower surface of a next higher die to the upper surface of the lower die such that the lower surface of the next higher die is superposed above the wires bonded to the lower die without contacting them, and such that a portion of the wires bonded to the lower die and inside the lateral periphery thereof are encapsulated in the adhesive.

11. The semiconductor package of claim 10, wherein the lateral periphery of the adhesive layer is equal to or greater than a lateral periphery of the next higher die.

12. The semiconductor package of claim 10, further comprising at least three microspheres having substantially the same diameter incorporated within the adhesive layer, and wherein the lower surface of the next higher die is spaced above the upper surface of the lower die by the microspheres.

13. The semiconductor package of claim 12, wherein at least one of the adhesive and the microspheres comprises a polymer.

14. The semiconductor package of claim 12, wherein the microspheres comprise glass, Teflon, silicon nitride, or silicon dioxide.

15. The semiconductor package of claim 12, wherein the adhesive layer comprises a central portion filled with microspheres and a peripheral portion free of microspheres surrounding the central portion, and wherein the lower surface of the higher die is spaced apart from the upper surface of the lower die by a single layer of the microspheres.

16. The semiconductor package of claim 10, further comprising a monolithic body of an encapsulant over the dies, the wires, and at least a portion of the substrate.

17. A semiconductor package, comprising:

a substrate;

a stack of semiconductor dies coupled to the substrate, each die having an upper surface with plurality of wire bonding pads around a periphery thereof and a plurality of wires bonded between the pads and the substrate, and wherein adjacent ones of the dies in the stack are spaced apart from each other by interleaved dielectric spacers located inside the bonding pads of the lower one of the dies; and, a layer of a cured dielectric adhesive substantially occupying a peripheral space around the spacer and between the opposing surfaces of the adjacent dies, the adhesive layer having a lateral periphery equal to or greater than a lateral periphery of the lower one of the adjacent dies and attaching a lower surface of the next higher die to the upper surface of the lower die such that a portion of the wires bonded to the lower die and inside the lateral periphery thereof are encapsulated in the adhesive.

18. The semiconductor package of claim 17, wherein the lateral periphery of each adhesive layer is equal to or greater than a lateral periphery of the next higher die.

19. The semiconductor package of claim 17, wherein each spacer comprises a polyimide resin, a B-stage composite, a ceramic, or an oxide of silicon.

20. The semiconductor package of claim 10, wherein the lower die and the upper die are a same size.

21. The semiconductor package of claim 10, further comprising a monolithic body of a dielectric encapsulant material covering the stack of semiconductor dies and the periphery of the adhesive layer.

22. The semiconductor package of claim 17, wherein the adjacent dies are a same size.

23. The semiconductor package of claim 17, further comprising a monolithic body of a dielectric encapsulant material covering the stack of semiconductor dies and the periphery of the adhesive layer.

24. An assembly of semiconductor dies comprising:

a first semiconductor die with a first surface having a plurality of wire bonding pads adjacent a periphery thereof;

a plurality of fine metal wires each having a first end in a connection with a respective one of the wire bonding pads;

a layer of a dielectric adhesive covering the first surface of the first semiconductor die and encapsulating the respective wire bonding pads and the first end of the respective wires connected thereto, without contacting a segment of each of the respective wires outward of a perimeter of the first semiconductor die; and a second semiconductor die coupled to the first surface of the first die by the adhesive layer, wherein the second semiconductor die superposes the wire bonding pads of the first semiconductor die without contacting the wires.

25. The assembly of claim 24, wherein the adhesive is filled with microspheres, and wherein the second semiconductor die is spaced above the first surface of the first semiconductor die by a single layer microspheres.

26. The assembly of claim 24, further comprising a spacer interposed between the top surface of the first semiconductor die and the second semiconductor die, the spacer having a perimeter located inside of the wire bonding pads on the first surface of the first semiconductor die, and wherein the adhesive layer occupies a peripheral space around the spacer and between the first and second semiconductor dies.

27. The assembly of claim 24, wherein the adhesive layer comprises a first portion filled with microspheres and a second portion free of microspheres surrounding the first portion, the second semiconductor die being spaced apart from the first surface of the first semiconductor die by a single layer of the microspheres, and the second portion of the adhesive layer occupying a peripheral space around the first portion thereof and between the first and second semiconductor dies.

* * * * *

UNITED STATES PATENT AND TRADEMARK OFFICE
CERTIFICATE OF CORRECTION

PATENT NO. : 6,472,758 B1
DATED : October 29, 2002
INVENTOR(S) : Thomas P. Glenn et al.

It is certified that error appears in the above-identified patent and that said Letters Patent is hereby corrected as shown below:

Column 2,
Line 46, delete "automat ed" and insert -- automated --;

Column 10,
Line 26, insert -- the -- before "two";
Line 57, delete "micropheres" and insert -- microspheres --;
Line 63, insert -- next -- before "higher"; and Column 12,
Line 22, insert -- of the -- after "layer".

Signed and Sealed this

Fourth Day of March, 2003

JAMES E. ROGAN
*Director of the United States Patent and Trademark Office*